(12) United States Patent
Wu

(10) Patent No.: US 7,920,075 B2
(45) Date of Patent: Apr. 5, 2011

(54) REGULATION CONTROL DEVICE WITH AN ENCODER AND ITS ENCODER MECHANISM

(75) Inventor: Cheng-Cheng Wu, Chung Ho (TW)

(73) Assignee: Dexin Corporation, Taipei Hsien (TW)

( * ) Notice: Subject to any disclaimer, the term of this patent is extended or adjusted under 35 U.S.C. 154(b) by 1139 days.

(21) Appl. No.: 11/642,516

(22) Filed: Dec. 21, 2006

(65) Prior Publication Data

US 2008/0150766 A1 Jun. 26, 2008

(51) Int. Cl.
*H03K 17/94* (2006.01)

(52) U.S. Cl. .............. 341/35; 341/20; 200/5 R; 345/184

(58) Field of Classification Search .............. 341/20–35; 200/5 R, 314; 345/184
See application file for complete search history.

(56) References Cited

U.S. PATENT DOCUMENTS

| | | | |
|---|---|---|---|
| 4,394,546 A * | 7/1983 | Harumatsu | 200/5 R |
| 5,430,511 A * | 7/1995 | Paff et al. | 396/427 |
| 5,619,021 A * | 4/1997 | Yamamoto et al. | 200/6 A |
| 6,188,332 B1 * | 2/2001 | Scarlata | 341/35 |
| 7,053,320 B2 * | 5/2006 | Kodo et al. | 200/17 R |
| 2002/0057064 A1 * | 5/2002 | Onodera | 318/2 |
| 2005/0284737 A1 * | 12/2005 | Shitanaka et al. | 200/5 R |
| 2006/0012584 A1 * | 1/2006 | Vassallo et al. | 345/184 |

* cited by examiner

*Primary Examiner* — Timothy Edwards, Jr.
(74) *Attorney, Agent, or Firm* — Rosenberg, Klein & Lee (57) ABSTRACT

A regulation control device comprises an encoder mechanism and a shell set. The encoder mechanism includes a base, a PCB, and an encoder, the PCB being arranged on a side of the substrate and a fixed shaft on an opposite side of the PCB being arranged in the base. The encoder connects the base and electrically connects the PCB. The shell set includes a press shell, a connecting seat, a rotating seat, and a supporter, the press shell being at a side of the base, the connecting seat being on the other side of the base, connecting the encoder, and being in the rotating seat connecting the connecting seat so that the connecting seat and the rotating seat can be rotatably assembled with the encoder. With the encoder mechanism, the device may provide a better effect of repeated clockwise/counter-clockwise rotation at the angle of 360.

16 Claims, 7 Drawing Sheets

REGULATION CONTROL DEVICE WITH AN ENCODER AND ITS ENCODER MECHANISM

BACKGROUND OF THE INVENTION

1. Field of the Invention

The present invention relates to a regulation control device and particularly to a regulation control device with an encoder mechanism, which provides an effect of repeated clockwise/counter-clockwise rotation at the angle of 360.

2. Description of Related Art

A conventional volume device can be installed in, for example, a vehicle, an in-home entertainment system or a PC or the like as sounder equipment to adjust the volume and tone of a loud/speaker.

Figure 1:
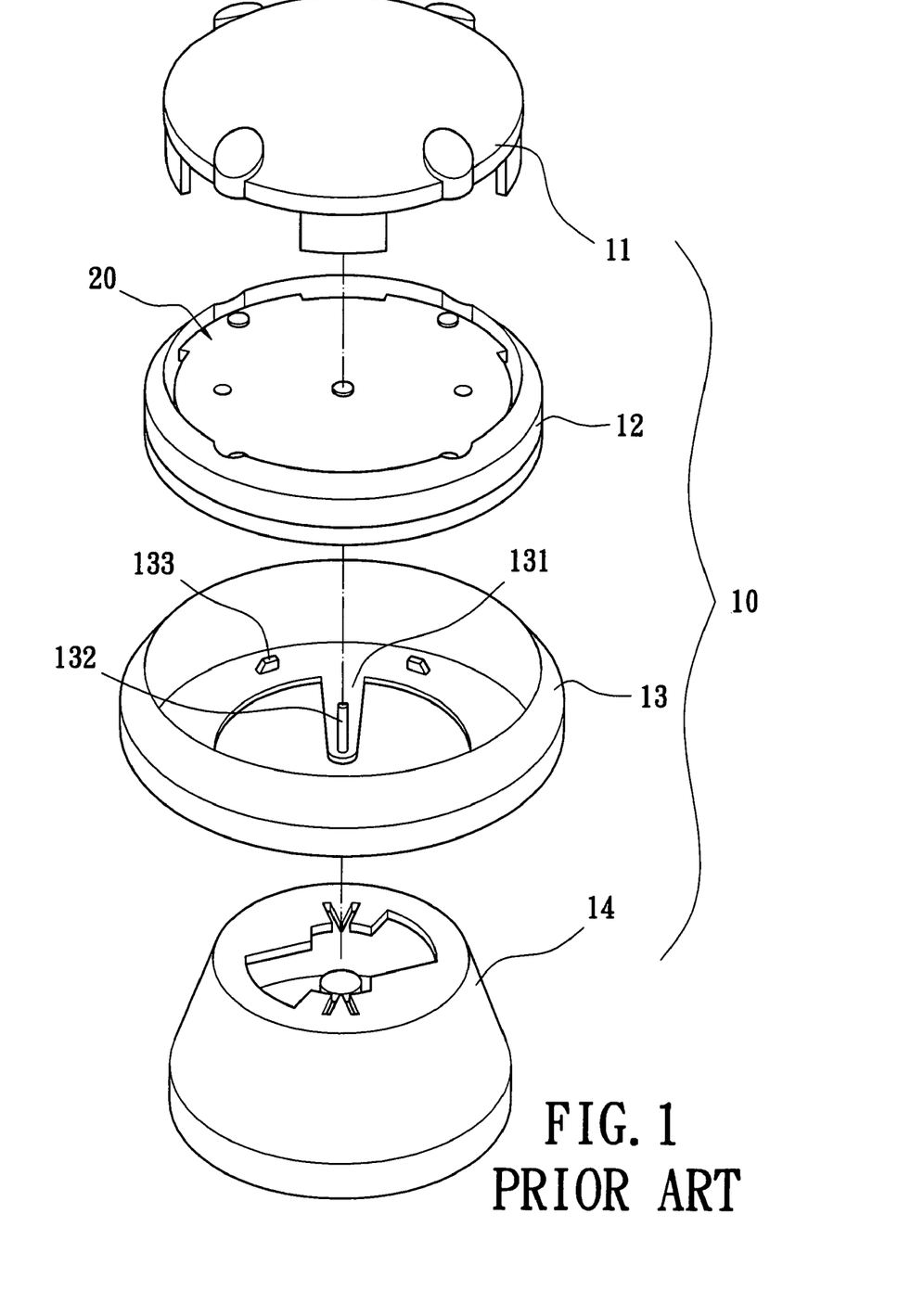
FIG. 1 is a 3D exploded view of a conventional volume control device.
Figure 2:
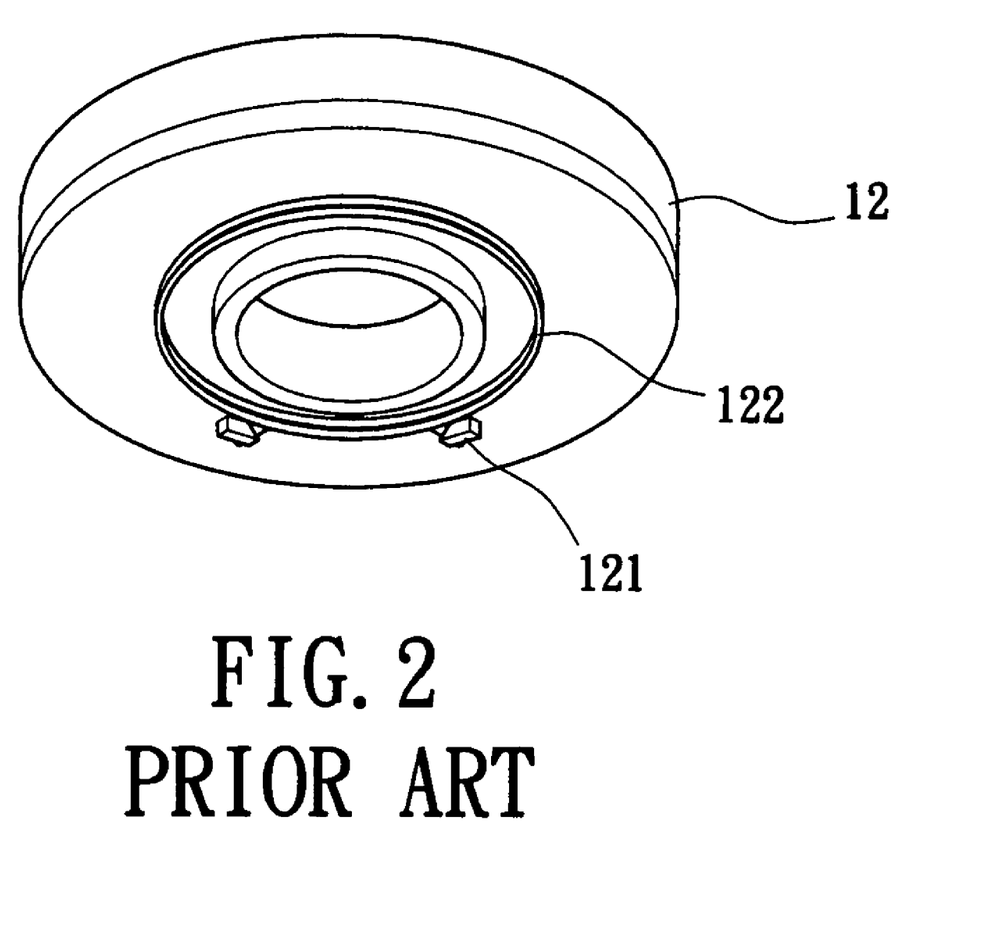
FIG. 2 is a 3D view of a connecting seat of the conventional regulation control device seen from another viewing angle.

As shown in FIGS. 1 and 2, the conventional regulation control device comprises a shell set 10 and a control circuit element 20 arranged in the shell set 10. The shell set 10 includes a press shell 11, a connecting seat 12, a rotating seat 13, and a supporter 14 that are assembled together. The control circuit element 20 is arranged in the connecting seat 12, and two first wedge lumps 121 are disposed at the bottom side of connecting seat 12 to wedge each two ends of a circular torsion spring 122. A hung mounting portion 131 is formed in the center of the rotating seat 13 where a contact pillar 132 protrudes towards the control circuit element 20 to contact where two second wedge lumps 133 are disposed in a protruding manner. Each of the second wedge lumps 133 are arranged at a nearby side of the first wedge lump 121, in order to wedge the two ends of the torsion spring 122. Thus, when the rotating seat 13 is rotated with the contact pillar 132 associated with the control circuit element 20, a control signal is generated to control the volume of loudspeaker.

However, the rotation path of the conventional rotating seat 13 is limited to the design of the structure between the torsion spring 122, the first wedge lump 121, and second wedge lump 133. When the rotating seat 13 is rotated clockwise or counter-clockwise, one of the second wedge lumps 133 drives one end of the torsion spring 122 to move around to a position where the other second wedge lump 133 lies, and thus the rotation path is limited to the designed structure herein. Due to the applied force of torsion spring 122 the rotating seat 13 is made to automatically return to its original position. Thus, the rotation travel is limited to the designed structure and maintains a fixed angle and returns to its original position. There is also the problem of unstable volume, which makes the device inconvenient when being used.

Hence, the inventors of the present invention suggest the present invention which is of reasonable design and an effective improvement on the shortages described above.

SUMMARY OF THE INVENTION

The present invention is mainly to provide a volume control device, which provides a better effect of repeated clockwise/counter-clockwise rotation at the angle of 360.

In order to achieve the objective mentioned above, the present invention provides a regulation control device comprising an encoder mechanism that includes a base, a PCB, and an encoder, in which the PCB is arranged on a side of the PCB, a fixed shaft on a opposite side of the PCB is arranged in the base, and the encoder is connected with the base and electrically connected to the PCB. A shell set includes a press shell, a connecting seat, a rotating seat, and a supporter, in which the press shell is arranged on a side of the base, the connecting seat is arranged on the other side of the base, connected to the encoder, and arranged in the rotating seat connected to the connecting seat so that the connecting seat can be assembled with the encoder in a rotation way. The supporter is arranged on a side between the connecting seat and the rotating seat, and one end of the fixed shaft is connected to the supporter.

The advantage of the present invention is that the designed structure of the encoder mechanism, when being used, is not limited to the angle of rotation. This provides the effect of repeated clockwise/counter-clockwise rotation at the angle of 360 and prevents the device from returning to its original position.

In order to further understand the features and technical means of the present invention, refer to the detailed description according to the present invention accompanied with drawings; however, the accompanied drawings are provided for reference and illustration only and are not limited to the present invention.

DETAILED DESCRIPTION OF THE PREFERRED EMBODIMENTS

Now, the present invention will be described more specifically with reference to the following embodiments. It is to be noted that the following descriptions of preferred embodiments of the present invention are presented herein for the purpose of illustration and description only; it is not intended to be exhaustive or to be limited to the precise form disclosed.

Figure 3:
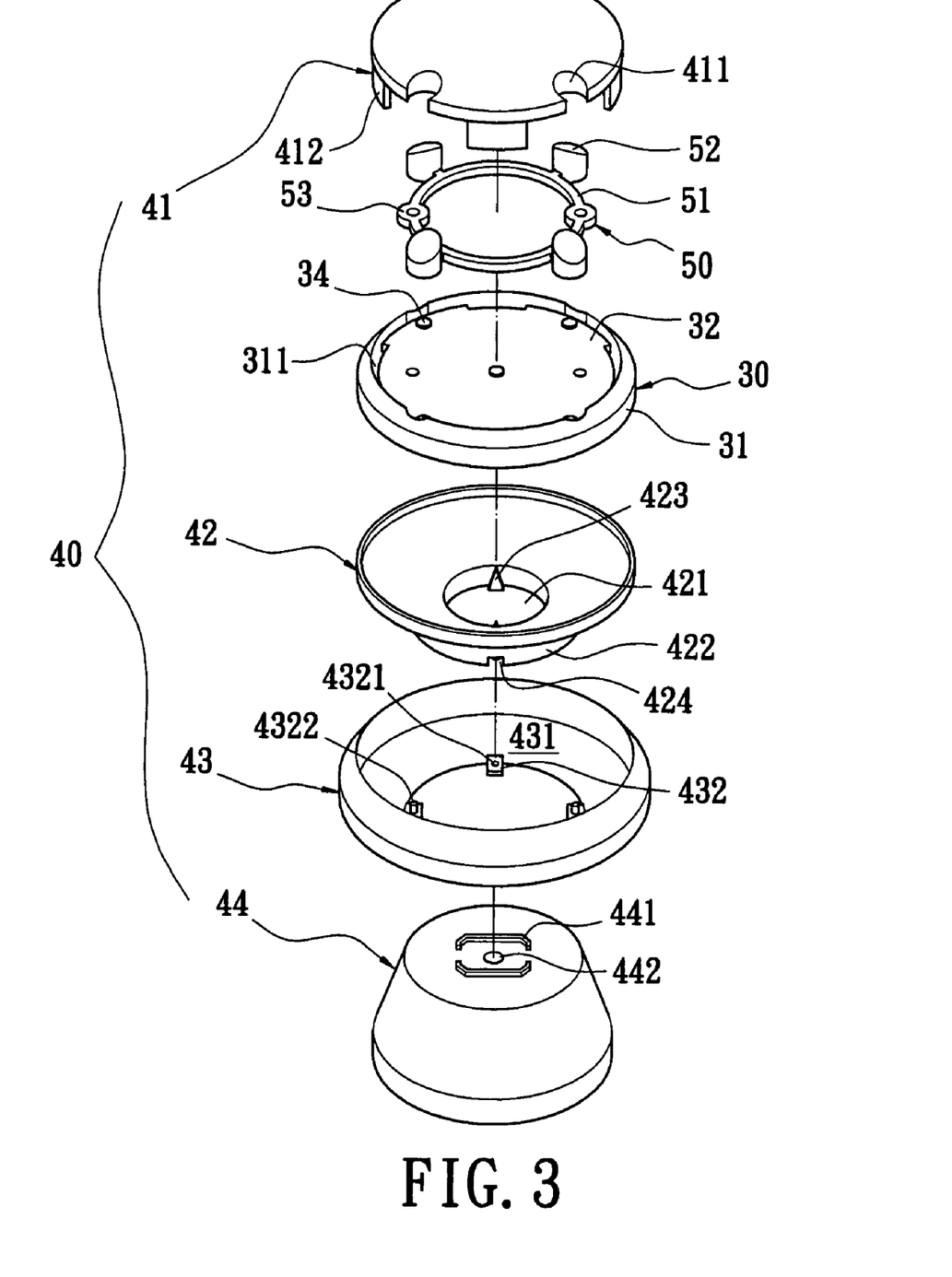
FIG. 3 is a 3D exploded view of the present invention.
Figure 4:
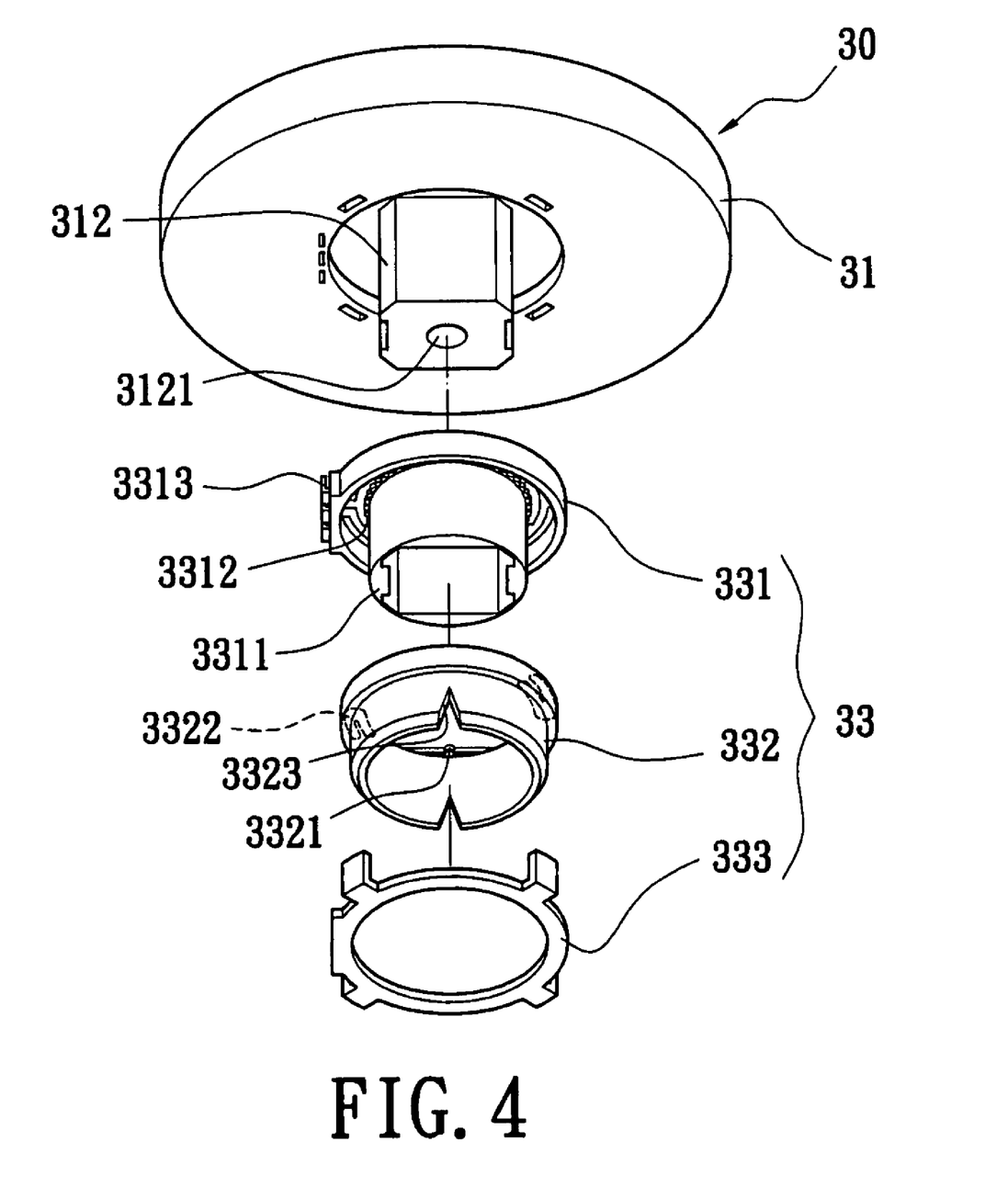
FIG. 4 is a 3D exploded view of an encoder mechanism of the present invention.
Figure 5:
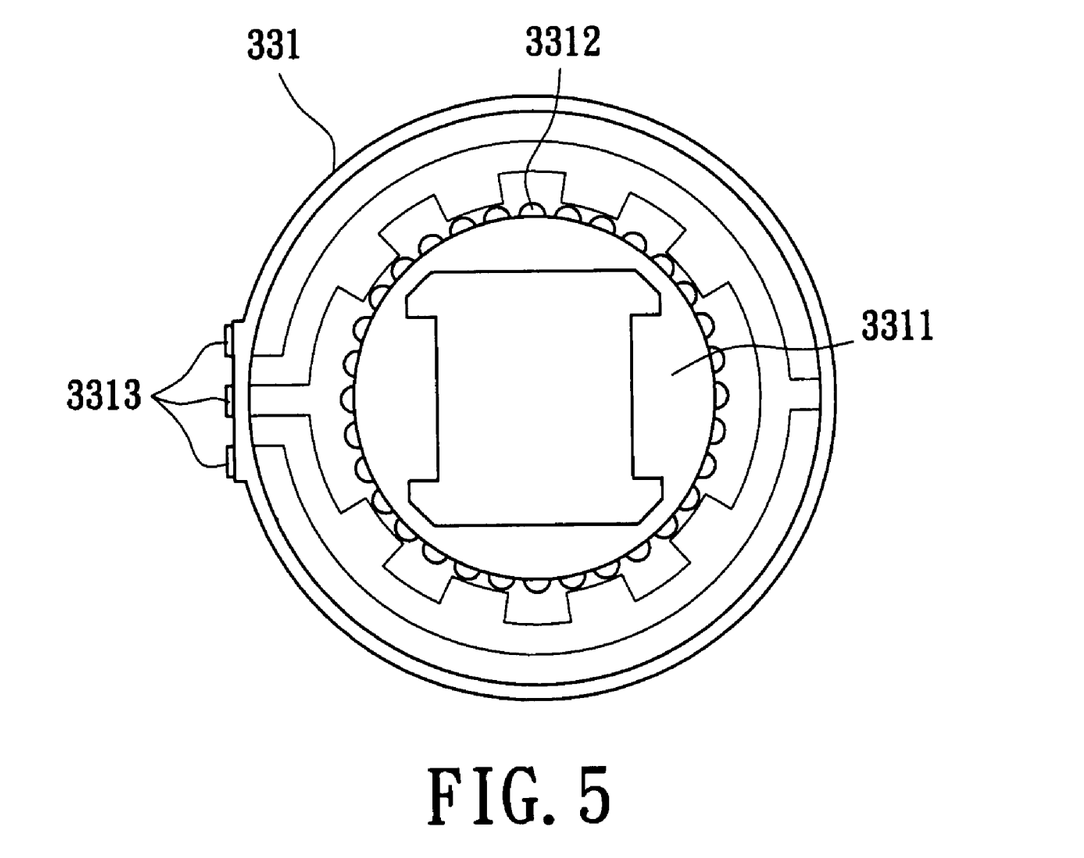
FIG. 5 is a bottom view of the body of an encoder of the present invention.

With reference to FIGS. 3 through 5, the present invention provides a regulation control device that is installed in a set of sounder equipment (not shown) to adjust the volume of a loudspeaker. The regulation control device comprises an encoder mechanism 30, a shell set 40, and a keystroke component 50.

The encoder mechanism 30 includes a base 31, a PCB 32, an encoder 33, and five touch switches 34. The base 31 is approximately the shape of a disc and provided with several joint holes 311. A fixed shaft 312 is disposed on and protrudes from the center of the base 31. The PCB 32 can be mounted with screws to a side of the base 31 and arranged opposite to the fixed shaft 312. The encoder 33 is set and connected from the fixed shaft 312 to the center of the shaft 31 and electrically connected to the PCB 32 to generate and transmit a control signal 32. The fixed shaft 312 stretches out of the encoder 33 and is axially bored to a hole 3121. Each of the touch switches 34 is electrically connected to the PCB 32, and four switches are arranged at intervals around the outer circle of the PCB 32. The other one of the touch switches 34 is arranged in the center of the PCB 32.

As shown in FIGS. 4 and 5, the encoder 33 includes a body 331, a rotation part 332, and a mounting part 333. From the center of the body 331, a hollow protruding part 3311 stretches to set the body 331 on the base 31 from the fixed shaft 312, and a plurality of tooth-like parts 3312 are formed around the protruding part 3311. The body 331 includes metal pins 3312 made of metal that stretch from the inside of the body 331 to the outside of the body 331 and are electrically connected to the PCB. One of the metal pins 3313 in the body 331 has the shape of a ring tooth, and the rest 3313 are arranged at intervals.

The inside of the rotation part 332 is hollow to rotatably connect to the body 331 and is set out of the protruding part 3311. A pull part 3321 stretches towards the inside of the top side to clench the tooth-like parts 3312 in the rotation way. Two conductive parts 3322 made of metal are formed and protrudes from the top of the rotation part 332 in the shape of bifurcation to contact two metal pins 3313 that have the shape of a ring tooth and are arranged at intervals. Thus, each of the two conductive parts 3322 is electrically conductive with each of the metal pins 3313 of the body 331 when rotating. Two notches 3323 are formed around the edge of the rotation part 332. The mounting part 333 is set in a circular manner on the body 331 and attached to the base 31 to fix the body 331 and the rotation part 332 and prevent them from separating.

Figure 6:
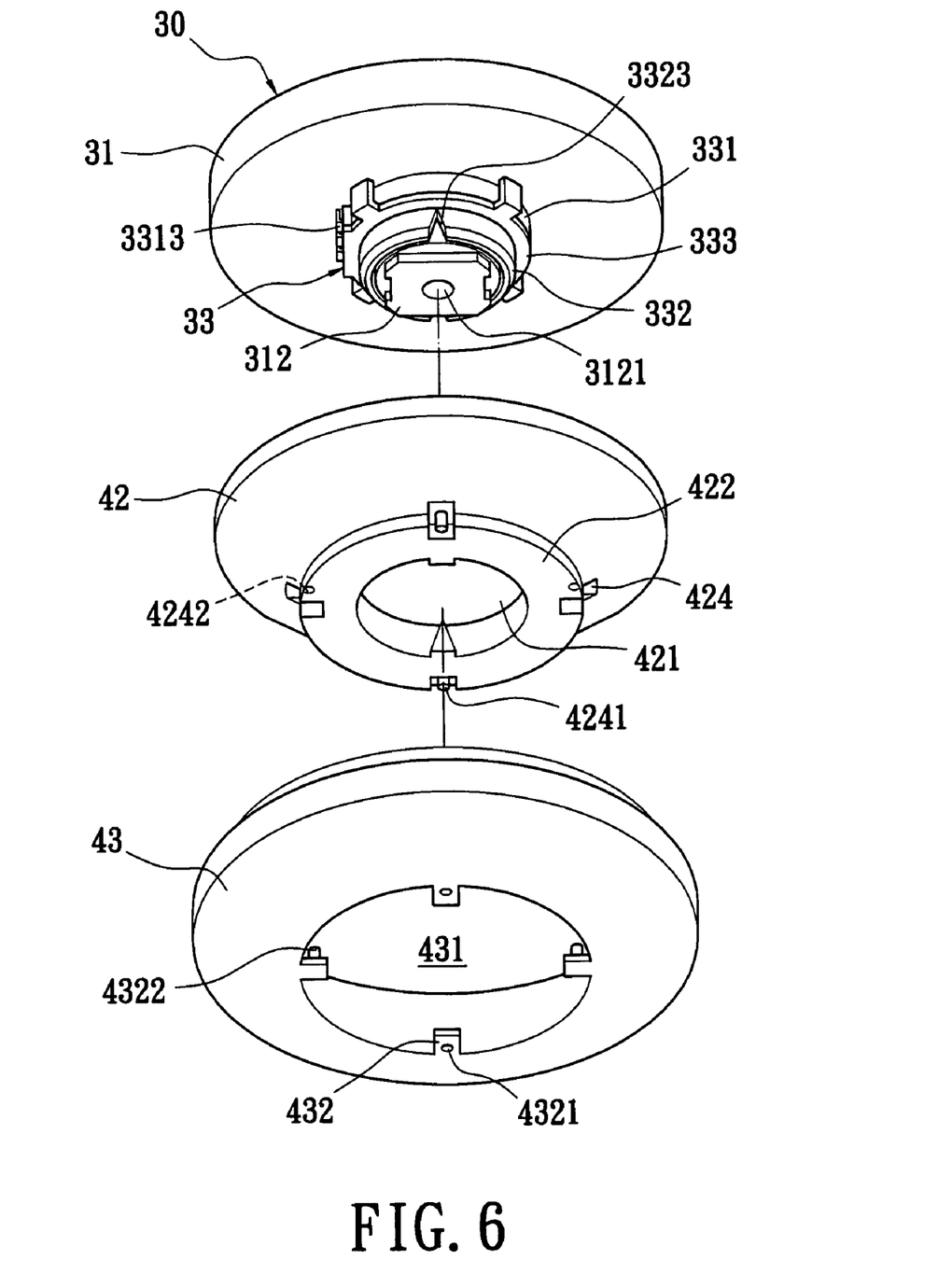
FIG. 6 is a 3D view of the encoder mechanism, a connecting seat, and a rotating seat of the present invention seen from another viewing angle.
Figure 7:
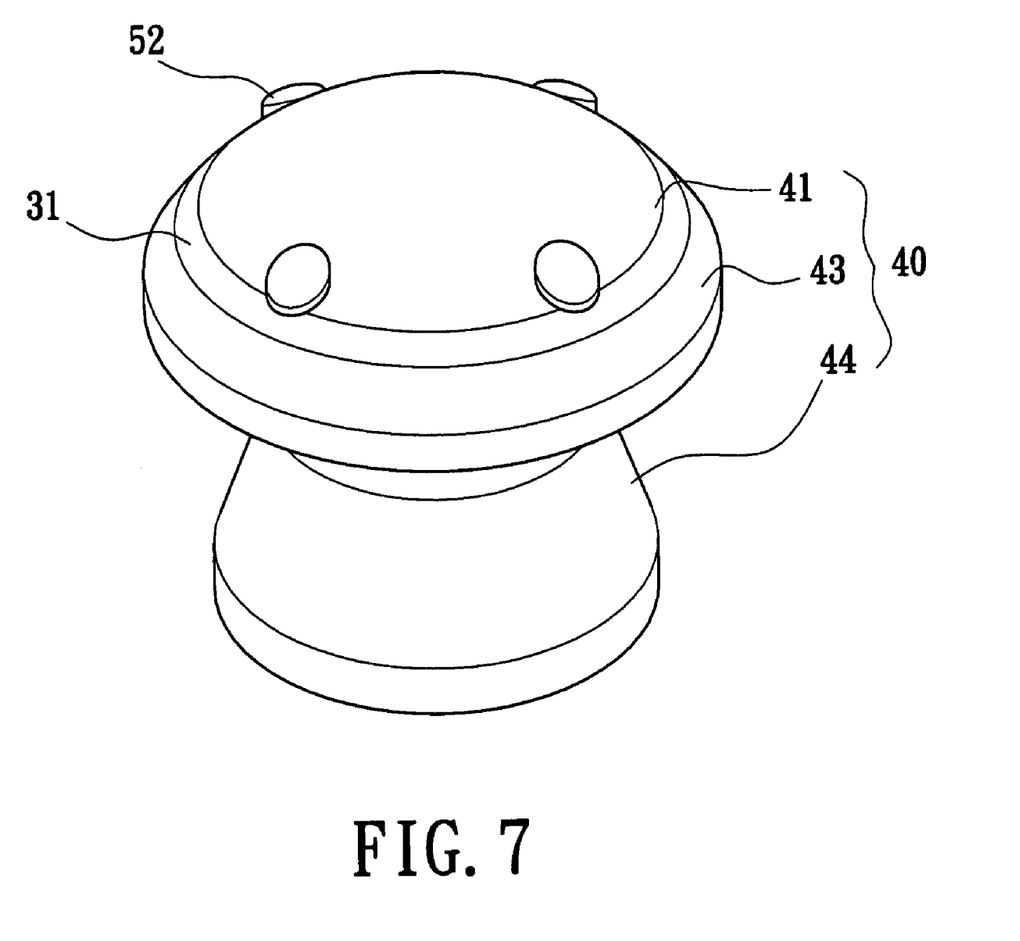
FIG. 7 is a 3D assembly drawing of the present invention.

With reference to FIGS. 3, 6, and 7, the shell set 40 includes a press shell 41, a connecting seat 42, a rotating seat 43, and a supporter 44. A pillar (not shown) stretches downwards from the center of the press shell 41, several concaves 411 sink inwards from the sides, and several joint parts 412 stretch downwards. The center of the connecting seat 42 is bored with a thru hole 421, from which an extension part 422 is formed stretching downwards. The connecting seat 42 includes two wedge parts 423 that each stretch to the thru hole 421. A plurality of grooves 424 are concavely formed in the extension part 422, pillars 4241 stretch from the grooves 424, and locating holes 4242 are set (on the outside of the extension part 422).

The inside of the rotating seat 43 is hollow so as to act as an accommodation space 431, in which a plurality of ribs 432 are provided horizontally extending to the space 431 and can be bored with open holes 4321, from which clamping pillars 4322 protrude. The inside of the supporter 44 is hollow, in which two fixing parts 441 opposite to each other stretch upwards from the upper side of the supporter 44 and a hole 442 penetrates through in the center of the supporter 44.

The keystroke component 50 includes a hollow ring 51 and four elastically-pressed keys 52 that are respectively connected to the sides of the ring 51 at equidistant intervals. The ring 51 has two pilot portions 53 on the opposite side.

The keystroke component 50 can be disposed on a side of the base 31 of the encoder mechanism 30. The pilot portions 53 of the ring 51 can be further fixed with screw bolts (not shown) to the base 31. Each of the keys 52 is disposed corresponded to the top where the four touch switches 34 lie near the fringes. The keys 52 are pressed to make the four touch switches 34 function. The press shell 41 can be pressed and arranged at a side of the base 31 so that the pillars correspond to the touch switches 34 in the center. The press shell 41 is pressed to make the pillars press the touch switches 34. Furthermore, each of the joint parts 412 stretch into each of the joint holes 311 to make the press shell 41 connected to the base 31. Also, each of the keys 52 is corresponsively arranged between the concave 411 and the base 31 and partially exposed to the press shell 41. The connecting seat 42 is arranged on the other side of the base 31, the fixing shaft 312 in the base 31 is made to pass through the thru hole 421, and the wedge part 423 of the connecting seat 42 is wedged into the notch 3323 of the rotation part 332.

Next, the connecting seat 42 can be arranged in the accommodation space 431 of the rotating seat 43 to wedge each of the ribs 432 into the groove 424. The clamping pillars 4322 are wedged into the locating holes 4242, and the open holes 4321 are connected to the pillars 4241 to wedge the connecting seat 42. The supporter 44 can be arranged at a side between the connecting seat 42 and the rotating seat 43. The fixing shaft 312 can be connected and fixed to the fixing part of the supporter 44 to block the base 31 of the encoder mechanism 30 from rotating. The piercing hole of the fixing shaft 312 and the penetrated hole 442 of the supporter 44 is provided for external signal lines (not shown) to pass through to electrically connect to the PCB 32 and then transmit control signals.

A user can turn the rotating seat 43 that meanwhile drives the rotation part 332 of the connecting seat 42 and the encoder 33. Due to the rotation part 332, the rotating seat 43 and the connecting seat 42 repeatedly run, the conductive part 3322 and the metal pin 3313 of the rotation part 332 are electrically conductive and generate the control signal in the PCB 32 for controlling the volume of the loudspeaker. Moreover, the press shell 41, the keystroke component 50, and the touch switch 34 can be used to generate adjustment signals in the PCB 32 for controlling the sound quality of the loudspeaker.

To sum up, the designed structure of the encoder mechanism 30 is not limited to the angle of rotation. The preset invention provides the effect of repeated clockwise/counter-clockwise rotation at the angle of 360 and prevents the prior art problem of the device returning to its original position, which causes unstable volume in the loudspeaker, thereby being inconvenient to use.

While the invention has been described in terms of what is presently considered to be the most practical and preferred embodiments, it is to be understood that the invention is not limited to the disclosed embodiment. On the contrary, it is intended to cover various modifications and similar arrangements included within the spirit and scope of the appended claims which are to be accorded with the broadest interpretation so as to encompass all such modifications and similar structures.

The invention claimed is:

1. A regulation control device, comprising:
an encoder mechanism including a base, a printed circuit board(PCB), and an encoder, wherein the PCB has a touch switch arranged on a side of the PCB, a fixed shaft on a opposite side of the PCB is arranged in the base, and the encoder is connected with the base and electrically connected to the PCB; and
a shell set including a press shell, a connecting seat, a rotating seat, and a supporter, wherein the press shell is arranged on a side of the base and corresponded to the touch switch for press, the connecting seat is arranged on the other side of the base, connected to the encoder, and arranged in the rotating seat connected to the connecting seat so that the connecting seat and the rotating seat can be assembled with the encoder in a rotation way, the supporter is arranged on a side between the connecting seat and the rotating seat, and one end of the fixed shaft is connected to the supporter;
wherein the encoder includes:
a body that is set and connected to the base out of the fixed shaft and includes a plurality of metal pins respectively stretching from the inside of the body to the outside of the body and being electrically connected to the PCB;
a rotation part that rotatably connect to the body and protrude to form with a plurality of conductive parts that are electrically conductive with the metal pins in a rotation way, in which the connecting seat is wedged into the rotation part; and a mounting part that fixes the body and the rotation part and connects to the base.

2. The regulation control device according to claim 1, wherein a hollow protruding part that is formed in the inside of body is arranged out of the fixing shaft, a plurality of tooth-like parts are formed around the fringes of the protruding part, and the rotation part has a pull part to clench the tooth-like parts in the rotation way.

3. The regulation control device according to claim 1, wherein there are three metal pins and two conductive parts in the shape of bifurcation respectively contact the two metal pins.

4. The regulation control device according to claim 1, wherein the rotation part has a notch and a wedge part is received in the connecting seat to wedge the notch.

5. The regulation control device according to claim 1, wherein the press shell extends a plurality of joint parts to stretch into a plurality of joint holes on the base.

6. The regulation control device according to claim 1, wherein the connecting seat has a plurality of grooves and a plurality of ribs in the rotating seat are provided that stretch to wedge the grooves.

7. The regulation control device according to claim 6, wherein pillars and locating holes are formed in the grooves and the ribs are formed with open holes and clamping pillars corresponding to each other.

8. The regulation control device according to claim 1, wherein a penetrated hole penetrates through the supporter, and a piercing hole axially penetrates through the fixing shaft to allow signal lines to pass through the penetrated hole and the piercing hole in order to electrically connect to the PCB.

9. The regulation control device according to claim 1, wherein a pair of fixing parts stretch from a side of the supporter and the fixing shaft is connected to the connecting part.

10. The regulation control device according to claim 1, further comprising a keystroke component arranged between the base and the press shell, another touch switch is disposed on the PCB corresponding to the keystroke component.

11. The regulation control device according to claim 10, wherein the keystroke component includes a ring and a plurality of elastically-pressed keys connecting the ring, the other touch switch includes a plurality of parts respectively corresponding to the keys.

12. An encoder mechanism of the volume control device, comprising:

a base having a fixing shaft disposed on one side;

a PCB connected to an second side of the base; and an encoder set and connected to the base out of the fixed shaft and electrically connected to the PCB, the encoder including:

a body that is set and connected to the base out of the fixed shaft and includes several metal pins respectively stretching from the inside of body to the outside of body and being electrically connected to the PCB;

a rotation part that rotatably connect to the body and protrude to form with a plurality of conductive parts that are electrically conductive with the metal pins in a rotation way; and a mounting part that fixes the body and the rotation part and connects to the base.

13. The encoder mechanism of the regulation control device according to claim 12, wherein a plurality of touch switches are disposed on the PCB.

14. The encoder mechanism of the regulation control device according to claim 12, wherein a hollow protruding part that is formed in the inside of body is arranged out of the fixing shaft, a plurality of tooth-like parts are formed around the fringes of the protruding part, and the rotation part has a pull part to clench the tooth-like parts in the rotation way.

15. The encoder mechanism of the regulation control device according to claim 12, wherein there are three metal pins and two conductive parts in the shape of bifurcation to respectively contact the two metal pins.

16. The encoder mechanism of the regulation control device according to claim 12, wherein a notch is formed around the fringes of the rotation part.

* * * * *